(12) United States Patent
Kohno

(10) Patent No.: US 6,222,266 B1
(45) Date of Patent: Apr. 24, 2001

(54) MINIATURIZATION OF A SEMICONDUCTOR CHIP

(75) Inventor: Junko Kohno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/145,235

(22) Filed: Sep. 2, 1998

(30) Foreign Application Priority Data

Sep. 25, 1997 (JP) .................................................. 9-260256

(51) Int. Cl.⁷ .................................................. H01L 23/48
(52) U.S. Cl. ........................ 257/734; 257/275; 257/773
(58) Field of Search .................................. 257/773, 275, 257/279, 280, 286, 287, 734

(56) References Cited

U.S. PATENT DOCUMENTS

| | | |
|---|---|---|
| 4,359,754 | 11/1982 | Hayakawa et al. . |
| 4,599,576 * | 7/1986 | Yoshida et al. ........................ 257/408 |
| 5,233,313 | 8/1993 | Kohno et al. . |
| 5,287,072 * | 2/1994 | Kojima et al. ........................ 257/275 |
| 5,371,405 | 12/1994 | Kagawa . |

FOREIGN PATENT DOCUMENTS

| | | |
|---|---|---|
| 2 566 581 | 12/1985 | (FR) . |
| 57-084180 | 5/1982 | (JP) . |
| 58-115866 | 7/1983 | (JP) . |
| 60-37170 * | 2/1985 | (JP) .................................... 257/773 |
| 61-059782 | 3/1986 | (JP) . |
| 6-085268 | 3/1994 | (JP) . |
| 8-274116 | 10/1996 | (JP) . |

* cited by examiner

*Primary Examiner*—J. Carroll
(74) *Attorney, Agent, or Firm*—Young & Thompson

(57) ABSTRACT

A source electrode, gate electrode, drain electrode, and a gate bus bar connected to said gate electrode are formed on a semiconductor chip. A field effect transistor unit constructed on the semiconductor chip is made up of three adjacent fingers each extending from the source electrode, gate electrode, and drain electrode. The source electrode is formed on the outer edge of the semiconductor chip from the obverse to the reverse surfaces of the semiconductor chip.

9 Claims, 15 Drawing Sheets

MINIATURIZATION OF A SEMICONDUCTOR CHIP

BACKGROUND OF THE INVENTION

1. Field of the Invention

The present invention relates to a semiconductor chip having a field effect transistor unit and a semiconductor device in which such a semiconductor chip is mounted.

2. Description of the Related Art

FIGS. 1–3 show the construction of a semiconductor device of the prior art disclosed in Japanese Patent Laid-open No. 274116/96.

As shown in FIG. 1, this prior-art semiconductor device has semiconductor chips 105 joined to a chip mounting section formed in the center of package 101 that is provided with input-side lead wiring 102 and output-side lead wiring 103. Input matching circuit substrate 114, on which an input wiring pattern is formed, and output matching circuit substrate 115, on which an output wiring pattern is formed, are provided on insulating plate inside package 101.

Gate electrode 106, source electrode 107, and drain electrode 108 are formed on the surface of semiconductor chip 105 as shown in FIG. 2. Field effect transistor unit 112 is made up of three adjacent fingers of gate fingers, source fingers, and drain fingers. Gate fingers extend from gate bus bar 110, which is connected to gate electrode 106, source fingers extend from source electrode 107, and drain fingers extend from drain electrode 108. A reverse-side source electrode (not shown in the figure) that is connected to a power source is formed on the reverse surface of source electrode 107; and source electrode 107 and the reverse-side source electrode are connected by source via-holes 109. Interbonding electrodes 111, which are to be connected to the gates of other semiconductor chips, are connected to both ends of gate bus bar 110.

As shown in FIG. 3, gate electrode 106 of semiconductor chip 105 is connected to input matching circuit substrate 114 by means of metal wires 116, and drain electrode 108 is connected to output matching circuit substrate 115 by way of metal wires 117. In addition, interbonding electrodes 111 of adjacent semiconductor chips 105 are connected together by metal wiring 113, and the gate voltage between each of semiconductor chips 105 is thus maintained at a constant level.

Still higher output of field effect transistor units can be achieved in the above-described semiconductor device of the prior art by increasing the gate width of the field effect transistor units on the semiconductor chips. Methods of increasing the gate width, which is the total extension of the gate fingers, include methods in which the length of the gate fingers is increased and methods in which the gate fingers are increased in number. If gate fingers are made longer, however, the output efficiency (gain) of the field effect transistor unit drops. If, on the other hand, the gate fingers are increased in number, the increase in the number of gate fingers while keeping gate pitch uniform to prevent deterioration of thermal resistance not only mandates an increase in the area of the semiconductor chip, but also results in the occurrence of phase differences between the input signals due to increase in the width of the gate. Finally, increasing the gate width of a field effect transistor unit has the drawback that the areas of the gate electrode and drain electrode increase, and the area of the semiconductor chip therefore also increases considerably.

Reduction of source inductance, a type of parasitic component, was attempted in the prior art by supplying power to the source close to a field effect transistor unit by supplying power from the reverse side of the semiconductor chip by way of source via-holes formed in the source electrode. Unfortunately, the large area required for source electrodes in which source via-holes are formed has been an impediment to reducing the area of the overall semiconductor chip. In the previously described semiconductor device of the prior art, for example, a field effect transistor unit occupies 25% or less of the area of a semiconductor chip, and such a construction therefore impedes high integration of the semiconductor device and results in higher production costs.

Moreover, formation of source via-holes necessitates application of resist, light exposure, and development, followed by etching on the reverse side of the semiconductor chip. This processing gives rise to problems relating to the position for forming the source via-holes with respect to the source electrode, inadequate source power supply due to insufficient etching when forming via-holes, or conversely, via-holes that are larger than the source electrodes due to excessive etching when forming via-holes. Via-holes are filled by metal such as gold, but problems of inadequate source power supply have been encountered due to an insufficient amount of filler. A construction incorporating via-holes thus adversely affects reliability of the semiconductor device and complicates improvements in the productivity of semiconductor devices.

SUMMARY OF THE INVENTION

It is an object of the present invention to provide a semiconductor chip that allows a smaller area and improved productivity.

It is another object of the present invention to provide a semiconductor device that incorporates the above-described semiconductor chip.

According to one aspect of the present invention, a field effect transistor unit is made up of three adjacent fingers each extending from the source electrode, gate electrode, and drain electrode. The source electrode is formed on the outer edge of the semiconductor chip and from the obverse to the reverse surfaces of the semiconductor chip. The source electrode may thus occupy a smaller area because there is no need for forming source via-holes in source electrodes of the semiconductor chip. In addition, the lack of via-holes ensures the reliability of the semiconductor device.

A gate bus bar is preferably formed in a loop configuration along the source electrode on the obverse surface of the semiconductor chip.

Adoption of a construction in which at least one portion of the loop-formed gate bus bar is divided prevents the occurrence of parasitic oscillation in the field effect transistor unit.

A construction in which gate electrodes are formed on the corner portions of the semiconductor chip is preferable.

A construction in which a drain electrode is formed on the central portion of the semiconductor chip is preferable.

According to another aspect of the present invention, a semiconductor device is made up from: a chip mounting section in which semiconductor chips of the present invention are joined and mounted; an input matching circuit substrate to which gate electrodes of the semiconductor chips are to be connected; and an output matching circuit substrate to which the drain electrodes of the semiconductor chips are to be connected. By adopting a construction in which a plurality of gate electrodes are formed on the semiconductor chip with each gate electrode being connected to the input matching circuit substrate by a metal wire and each metal wire being formed to the same length, input signals transmitted on each metal wire are inputted to the semiconductor chip without phase differences between the input signals.

The above and other objects, features, and advantages of the present invention will become apparent from the following description with reference to the accompanying drawings which illustrate examples of the present invention.

DETAILED DESCRIPTION OF THE PREFERRED EMBODIMENTS

First Embodiment

Figure 4:
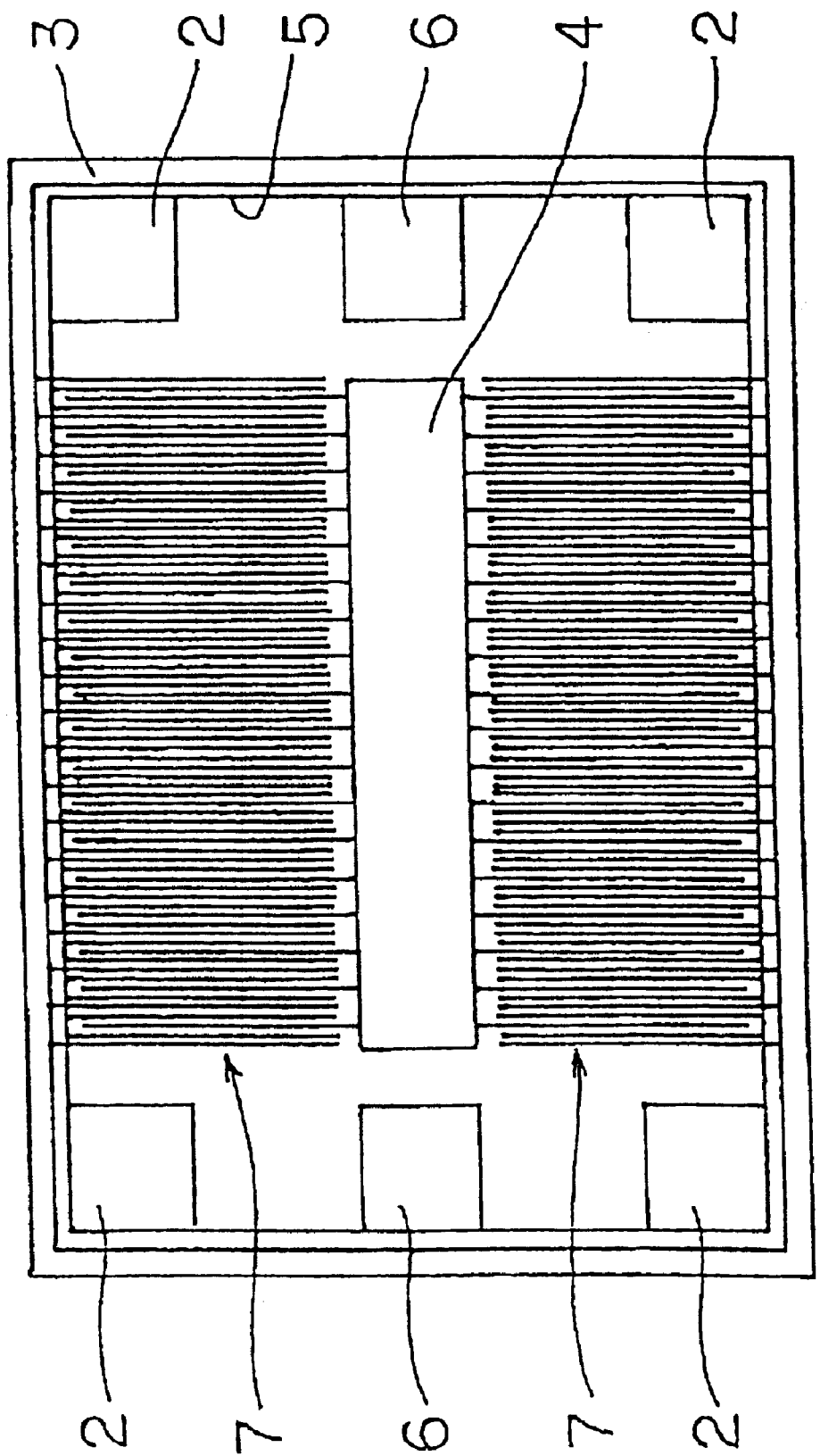
FIG. 4 is a plan view showing a semiconductor chip according to the first embodiment of a semiconductor device of the present invention.

As shown in FIG. 4, in the semiconductor chip in the semiconductor device of this embodiment, source electrode 3 is formed around the entire edge of the semiconductor chip so as to enclose the semiconductor chip from the obverse side to the reverse side. In addition, gate bus bar 5 is formed in a loop shape along the inner side of source electrode 3 on the obverse side portion of the semiconductor chip. Gate electrodes 2 are arranged in a connected state with gate bus bar 5 on the four corners of the semiconductor chip. Finally, interbonding electrodes 6 are provided on both side portions of the semiconductor chip in a connected state with gate bus bar 5, and drain electrode 4 is provided on the central portion of the semiconductor chip.

Field effect transistor units 7 are made up of three adjacent fingers of gate fingers 8, source fingers 9, and drain fingers 10. Gate fingers 8 extend from gate bus bar 5, which is connected to gate electrodes 2, source fingers 9 extend from source electrode 3, and drain fingers 10 extend from drain electrode 4. These fingers are formed on the obverse side of the semiconductor chip as shown in FIG. 5.

In a semiconductor chip configured as described above, source power supply is effected from the portion of source electrode 3 that is formed on the reverse side of the semiconductor chip, thereby obviating the need to form source via-holes in the source electrodes and allowing the source electrodes to have a smaller area. The area of a semiconductor chip can thus be reduced when the gate width (the total length of the gate fingers) is equal to that of the prior art, or in other words, the gate width can be increased without increasing the area of the semiconductor chip over that of the prior art. In addition, the lack of source via-holes allows an improvement in both the productivity and reliability of a semiconductor chip.

Figure 5:
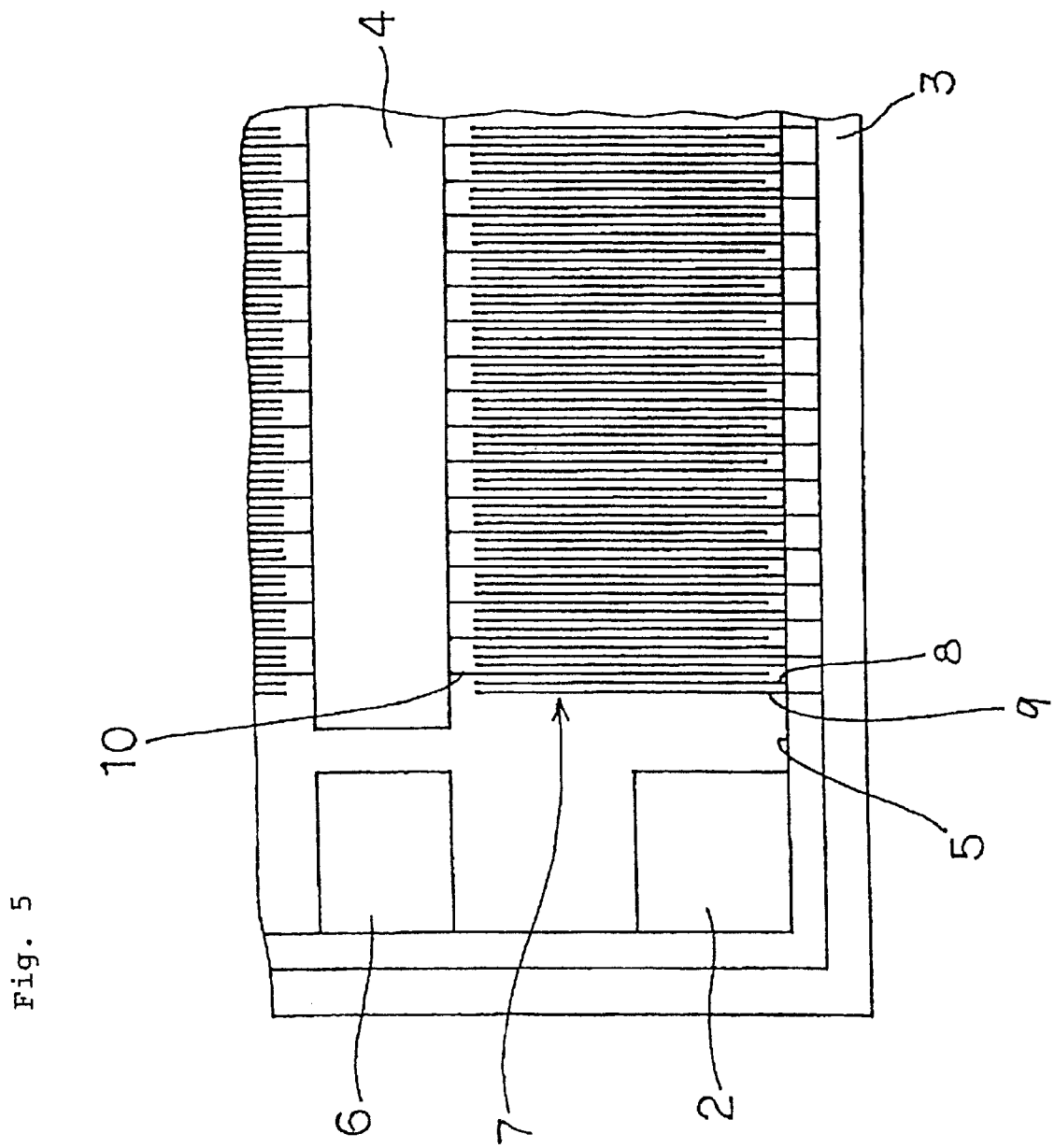
FIG. 5 is a plan view showing an enlargement of one portion of the semiconductor chip shown in FIG. 4.
Figure 6:
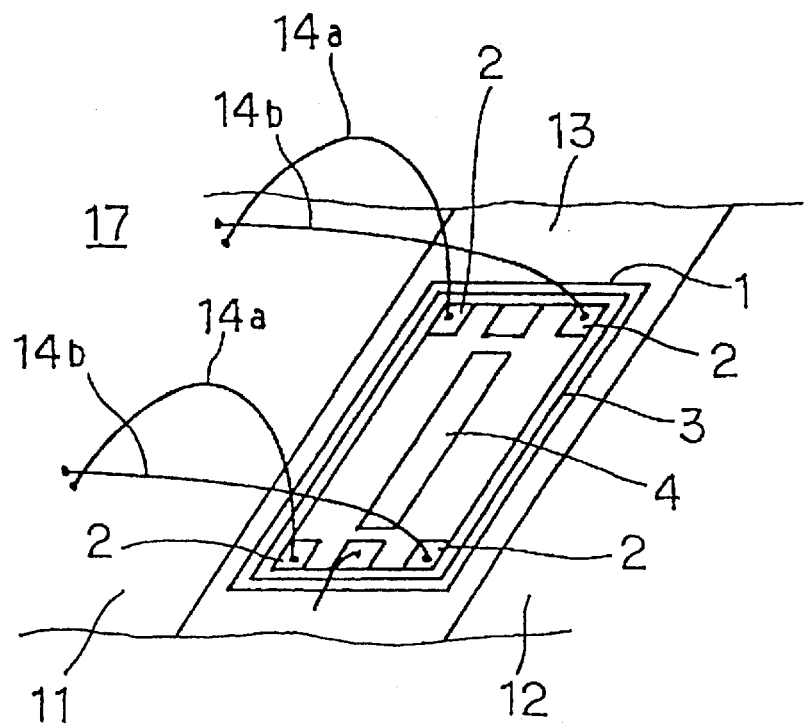
FIG. 6 is a perspective view showing the state of connections of the semiconductor chip shown in FIGS. 4 and 5 to the input matching circuit substrate of a semiconductor device.

FIG. 6 shows a case in which the semiconductor chip shown in FIG. 4 and FIG. 5 is connected to the input matching circuit substrate of a semiconductor device.

Figure 1:
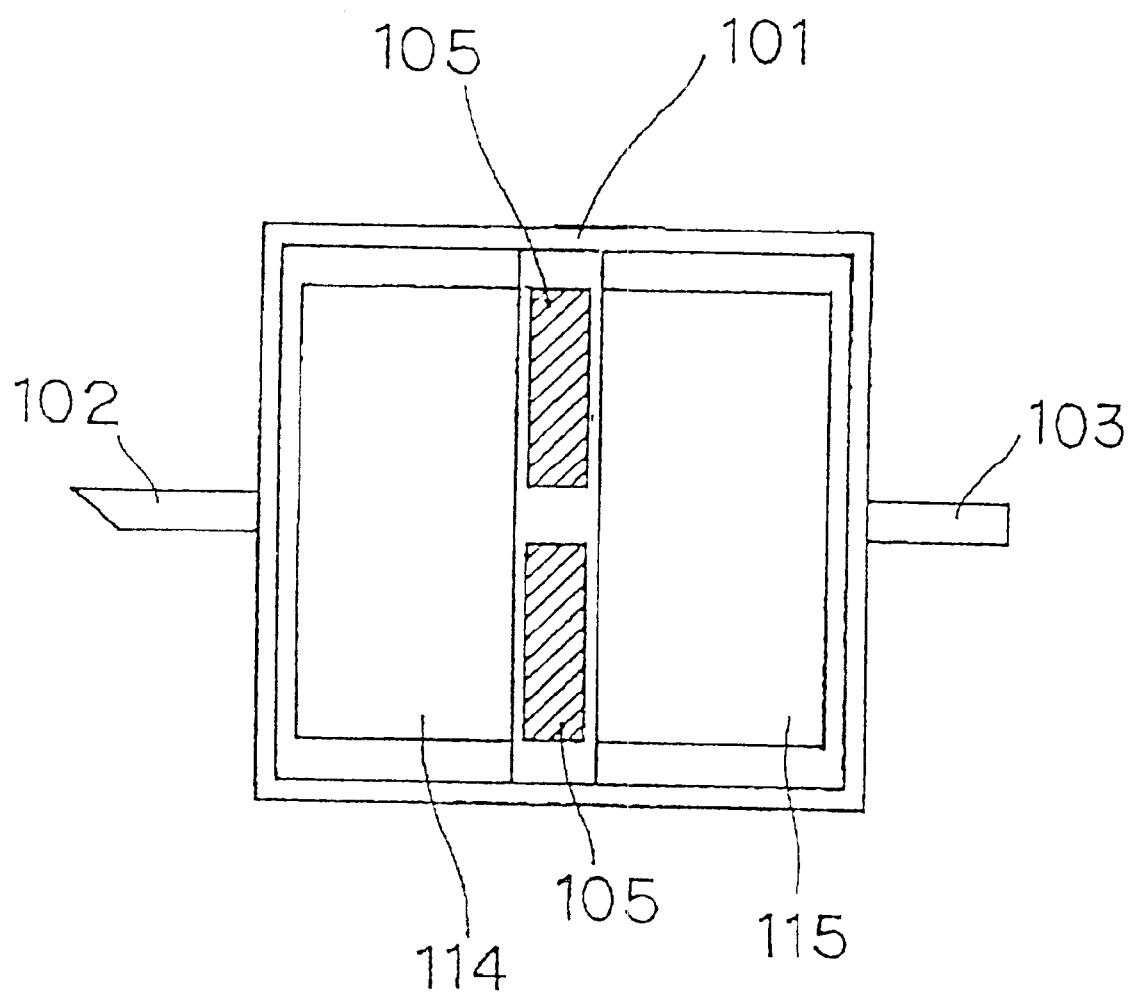
FIG. 1 is a plan view showing the interior of a semiconductor device of the prior art.
Figure 2:
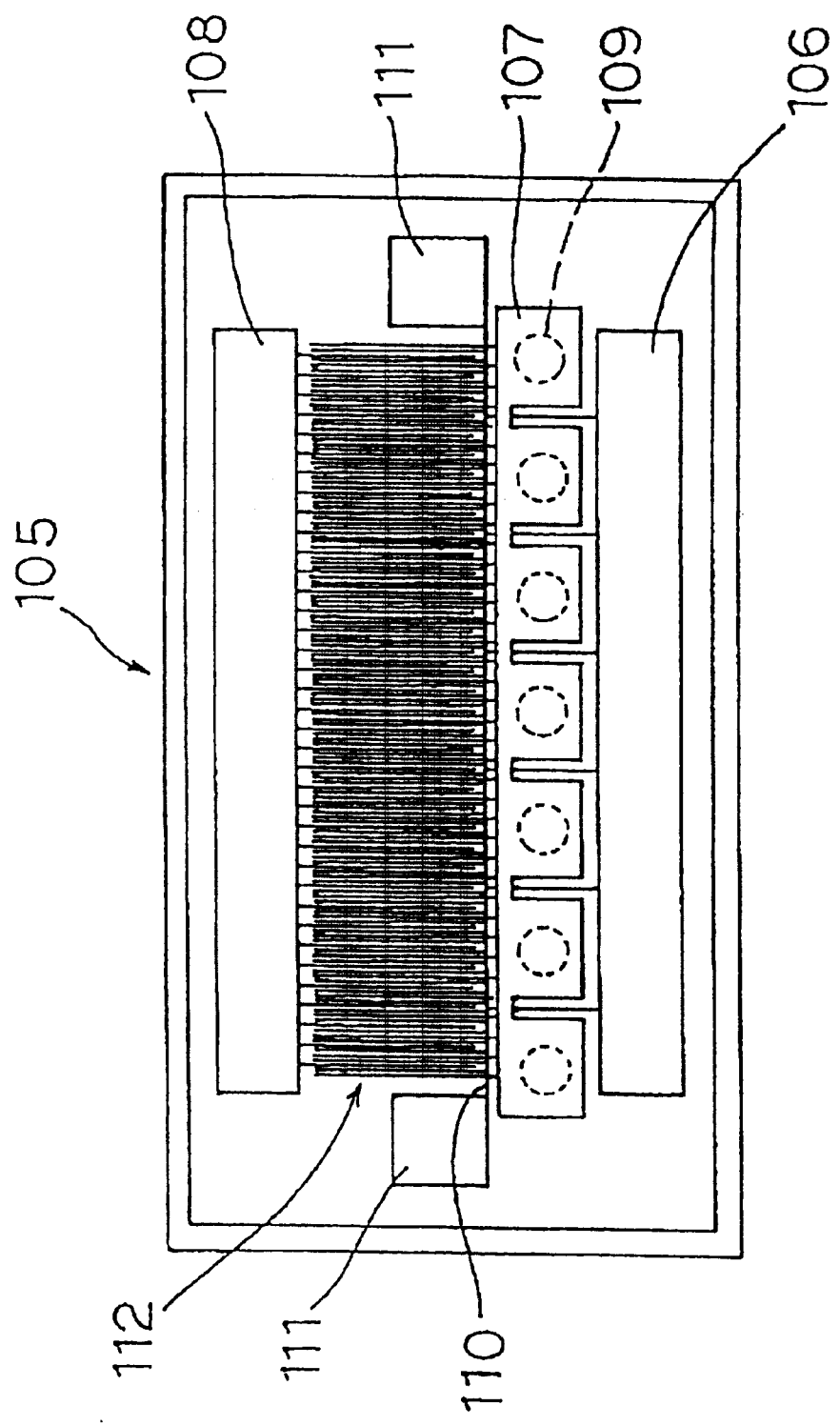
FIG. 2 is a plan view showing a semiconductor chip in the semiconductor device shown in FIG. 1.
Figure 3:
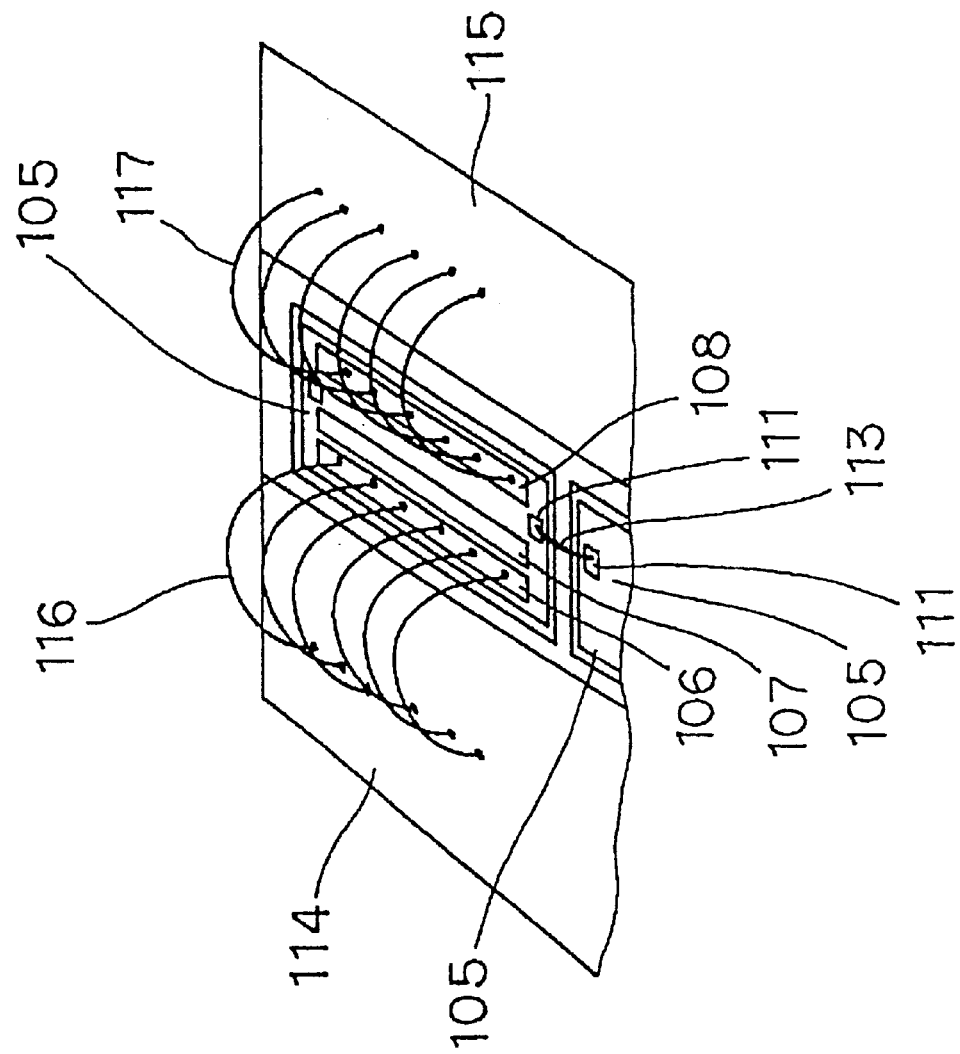
FIG. 3 is a perspective view showing the state of connections between the circuit substrate and semiconductor chip in the semiconductor device shown in FIG. 1.

In semiconductor device 17 of this embodiment, metal wires 14a, which connect input matching circuit substrate 11 to gate electrodes 2 positioned close to input matching circuit substrate 11, and metal wires 14b, which connect input matching circuit substrate 11 to gate electrodes 2 positioned far from input matching circuit substrate 11, are provided with the same length, as shown in FIG. 6. The construction of a package (not shown) provided with input matching circuit substrate 11, output matching circuit substrate 12, chip mounting section 13, input lead lines, and output lead lines of semiconductor device 17 is equivalent to the construction of the prior-art semiconductor device shown in FIG. 1, and detailed explanation is therefore here omitted.

With the above-described construction, each input signal that is transmitted over each of metal wires 14a and 14b can be inputted to the semiconductor chip without the occurrence of phase difference between the signals.

Moreover, source electrode 3 provided on the reverse side of semiconductor chip 1, is joined with chip mounting section 13, thereby effecting source power supply. Source power supply is therefore effected close to field effect transistor 7, and this reduces source inductance, a type of parasitic component.

Figure 7:
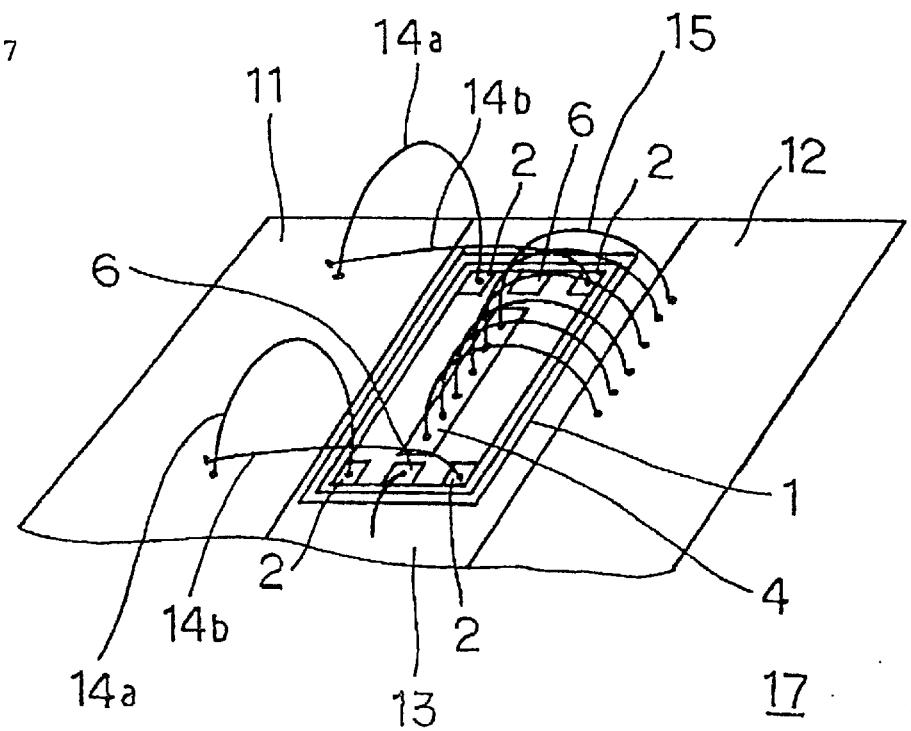
FIG. 7 is a perspective view showing the state of connections of the semiconductor chip shown in FIGS. 4 and 5 to the circuit substrate of a semiconductor device.
Figure 8:
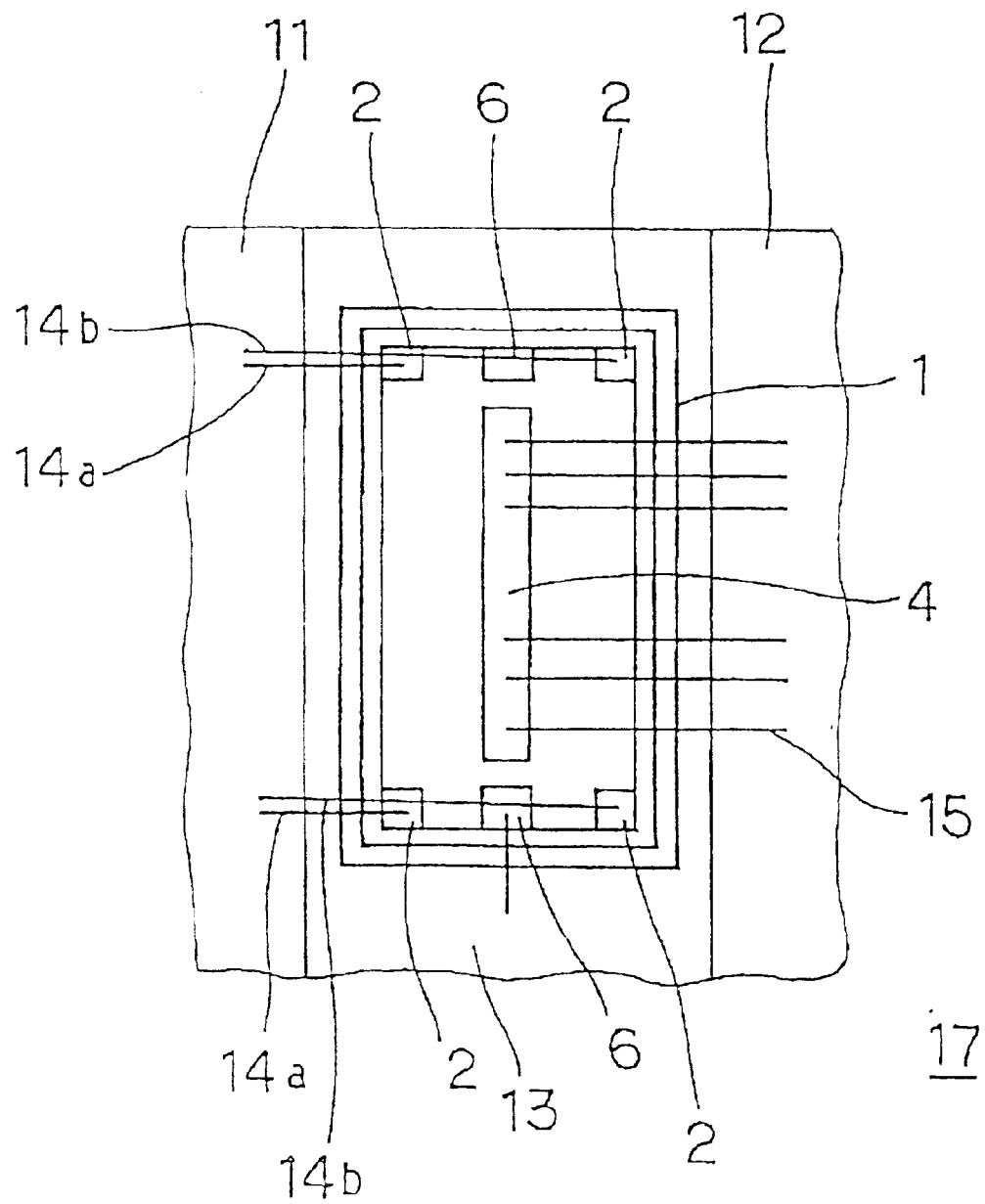
FIG. 8 is a plan view showing the semiconductor device shown in FIG. 7.

FIG. 7 and FIG. 8 show configurations in which the semiconductor chip shown in FIG. 4 and FIG. 5 is connected to the circuit substrate of a semiconductor device. Drain electrode 4 of semiconductor chip 1 is connected to the output matching circuit substrate 12 of semiconductor device 17 by a plurality of metal wires 15. As explained with reference to FIG. 6, gate electrodes 2 and input matching circuit substrate 11 are connected by means of metal wires 14a and 14b.

Figure 9:
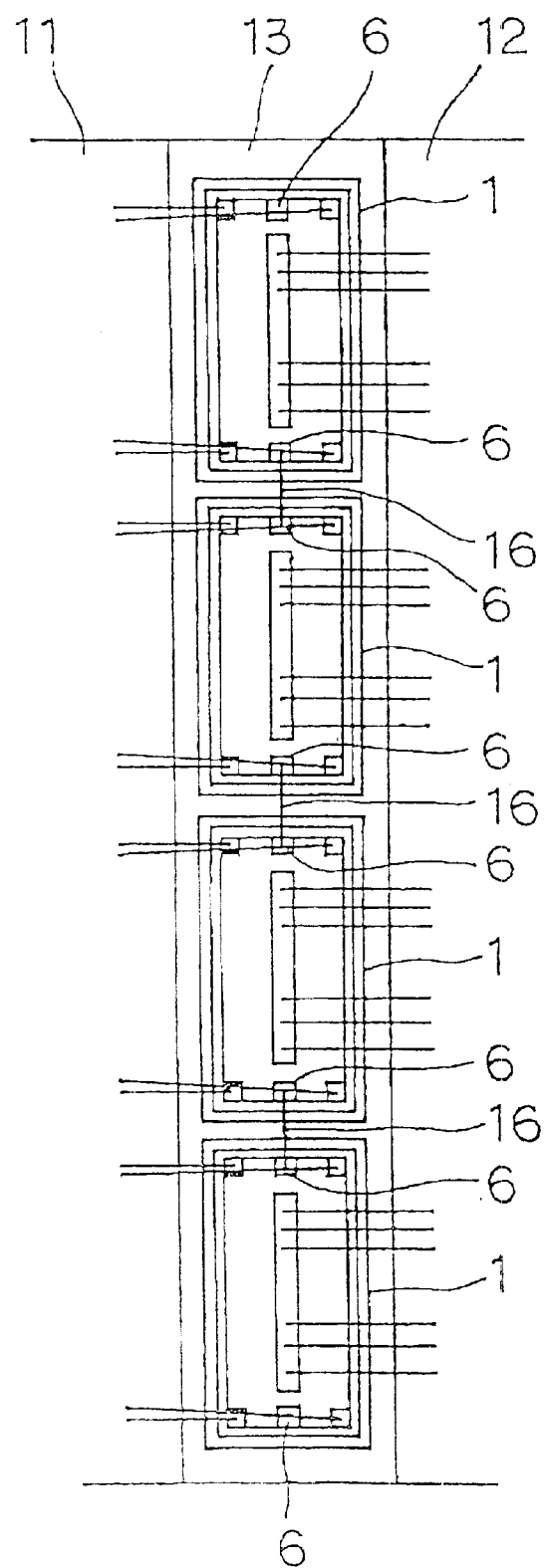
FIG. 9 is a plan view showing the state of four semiconductor chips connected in a string as an example of connecting a plurality of the semiconductor chip shown in FIGS. 4 and 5.

In addition, as shown in FIG. 9, a plurality of semiconductor chips are connected in a chain by connecting interbonding electrodes 6 of mutually adjacent semiconductor chips 1 by metal wires 16.

Second Embodiment

Figure 10:
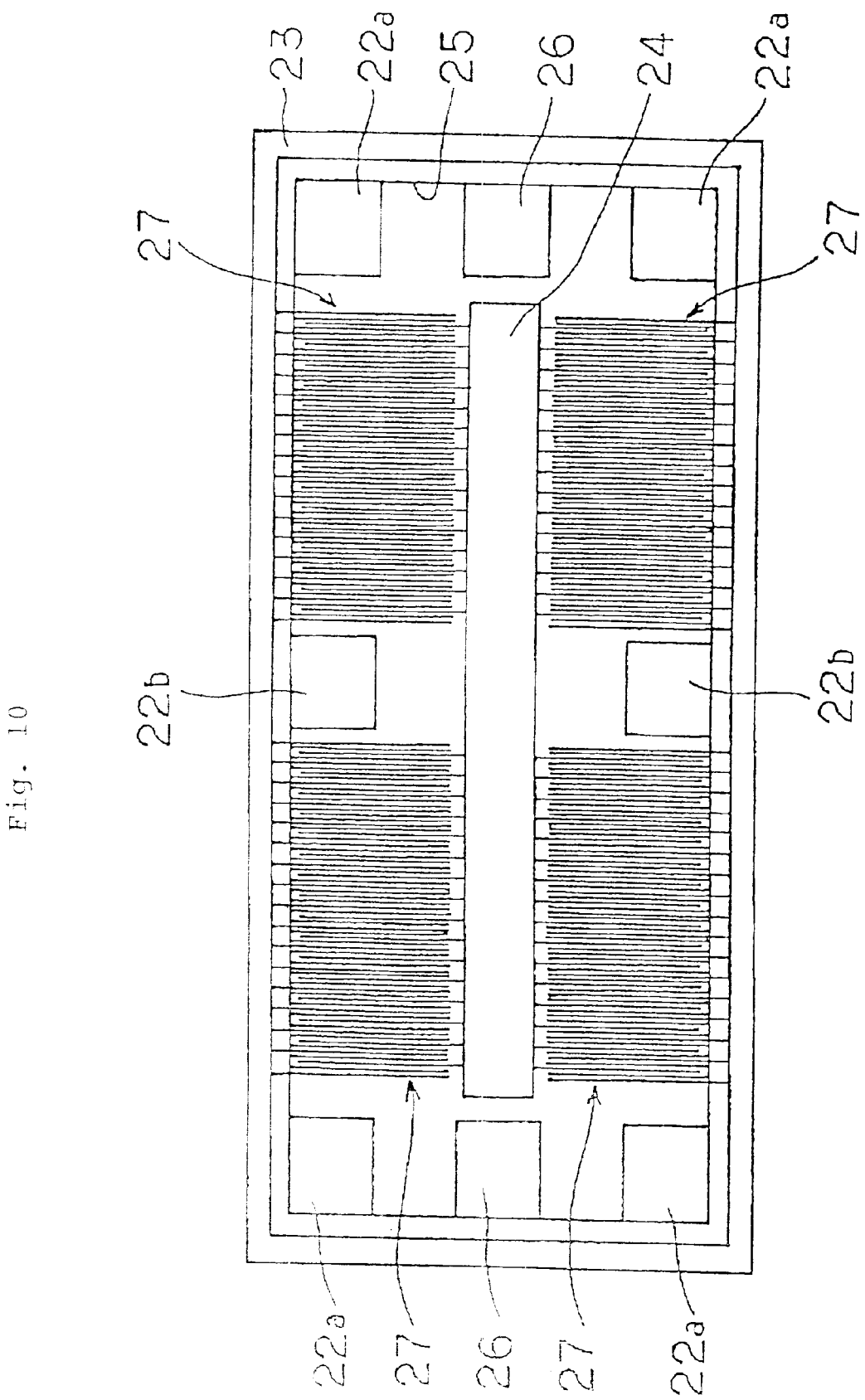
FIG. 10 is a plan view showing a semiconductor chip according to the second embodiment of the semiconductor device of the present invention.

In the semiconductor chip of the semiconductor device of this embodiment, gate electrodes 22b are also provided in the central edge portions of the semiconductor chip in addition to gate electrodes 22a provided in the four corners of the semiconductor chip, as shown in FIG. 10. The constructions of each of gate electrode 22a, source electrode 23, drain electrode 24, gate bus bar 25, interbonding electrodes 26, and field effect transistor units 27 of the semiconductor chip are equivalent to those of the semiconductor chip shown in FIG. 4 and FIG. 5, and detailed description is therefore here omitted.

In a case in which gate width is increased by increasing the number of gate fingers (not shown) of a field effect transistor unit, the difference between wiring lengths of portions close to gate electrodes and portions far from gate electrodes within the field effect transistor unit becomes more pronounced. In such a case, the output efficiency (gain) of the field effect transistor unit falls, particularly in high-frequency regions. However, if one or more gate electrodes 22b are provided in addition to gate electrodes 22a provided in the four corners of the semiconductor chip as in the present embodiment, the difference in wiring distance between portions of the field effect transistor that are close to the gate electrodes and far from the gate electrodes can be decreased even in cases in which the number of gate fingers of the field effect transistor are increased, thereby allowing the output efficiency of the field effect transistor unit to be maintained at a high level.

Figure 11:
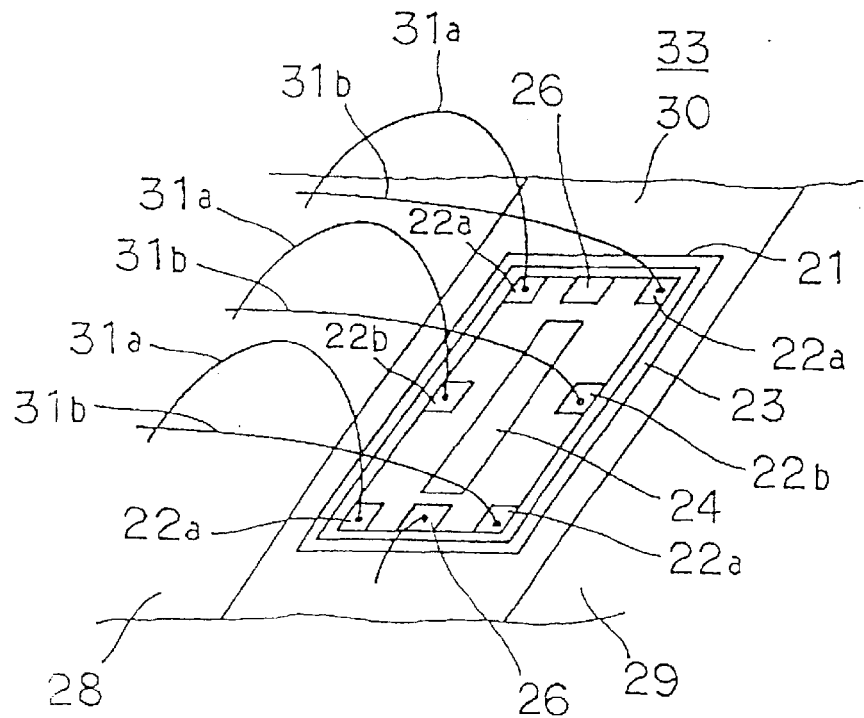
FIG. 11 is a perspective view showing the state of connection of the semiconductor chip shown in FIG. 10 to the input matching circuit substrate of a semiconductor device.

FIG. 11 shows a case in which the semiconductor chip shown in FIG. 10 is connected to the input matching circuit substrate of a semiconductor device. The construction of a package (not shown) provided with input matching circuit substrate 28, output matching circuit substrate 29, chip mounting section 30, input lead lines and output lead lines of semiconductor device 33 shown in FIG. 11 is equivalent to the construction of the prior-art semiconductor device shown in FIG. 1, and detailed explanation is therefore here omitted.

As with semiconductor device 17 shown in FIG. 6, semiconductor device 33 of this embodiment is provided with both metal wires 31a that connect input matching circuit substrate 28 to gate electrodes 22a and 22b that are positioned close to input matching circuit substrate 28 and metal wires 31b that connect input matching circuit substrate 28 to gate electrodes 22a and 22b that are positioned far from input matching circuit substrate 28. Metal wires 31a and 31b are provided with the same length. Input signals transmitted on each of metal wires 31a and 31b are therefore inputted to semiconductor chip 21 without the occurrence of phase difference.

Figure 12:
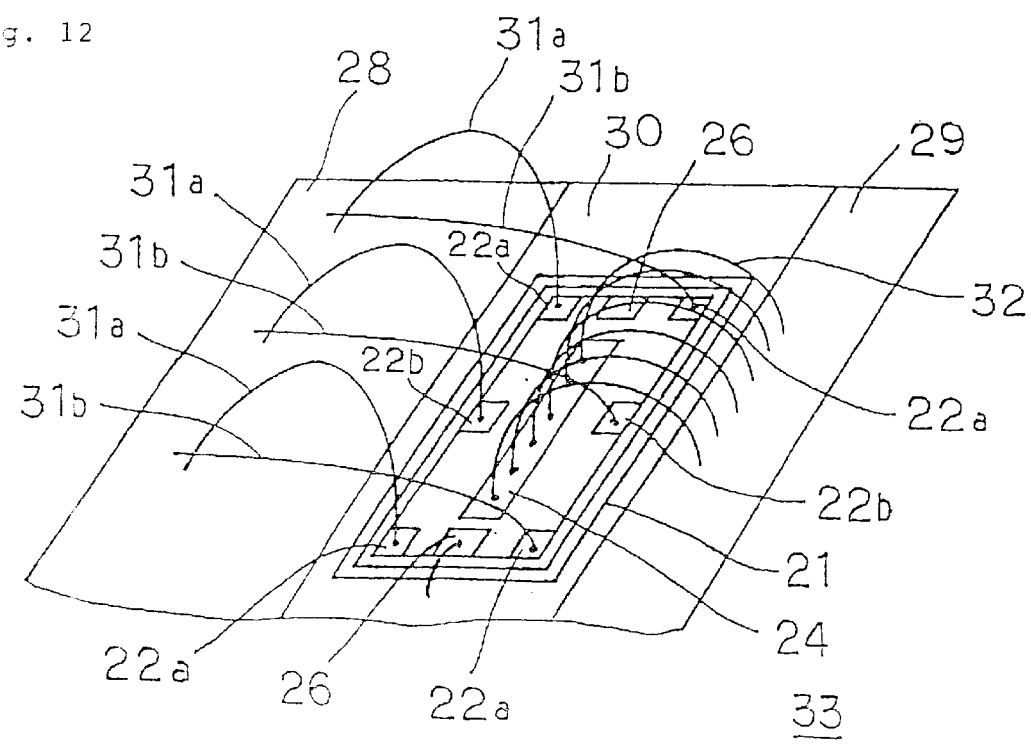
FIG. 12 is a perspective view showing the state of connection of the semiconductor chip shown in FIG. 10 to the circuit substrate of a semiconductor device.
Figure 13:
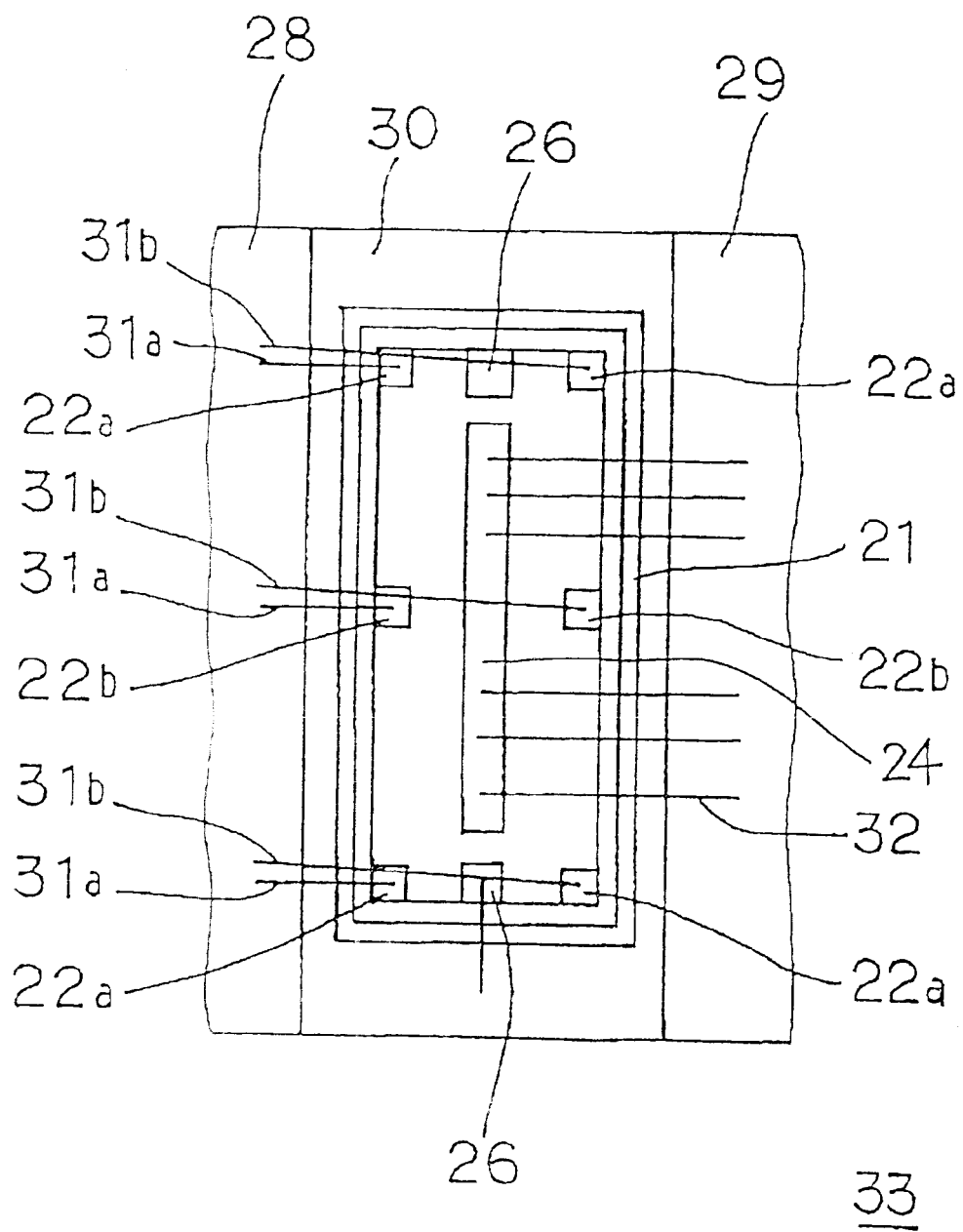
FIG. 13 is a plan view showing the semiconductor device shown in FIG. 12.

FIG. 12 and FIG. 13 each show cases in which the semiconductor chip shown in FIG. 10 is connected to the circuit substrate of a semiconductor device. Drain electrode 24 of semiconductor chip 21 is connected to output matching circuit substrate 29 of semiconductor device 33 by a plurality of metal wires 32. As explained with reference to FIG. 11, input matching circuit substrate 28 is connected to gate electrodes 22a and 22b by metal wires 31a and 31b.

Third Embodiment

Figure 14:
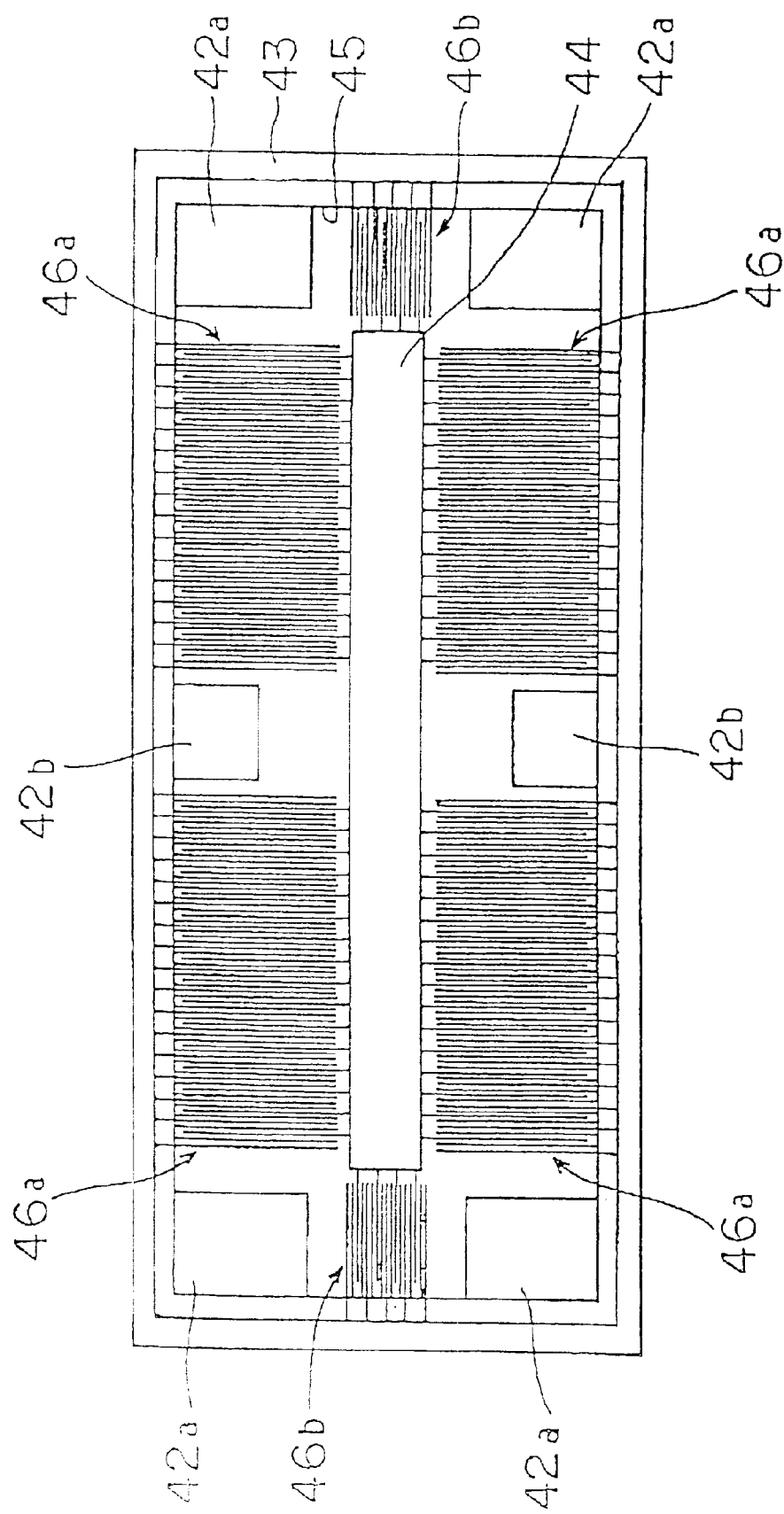
FIG. 14 is a plan view showing a semiconductor chip according to the third embodiment of a semiconductor device of the present invention.

As shown in FIG. 14, interbonding electrodes are not provided in the semiconductor chip of this embodiment, but the semiconductor chip of this embodiment is provided with field effect transistor units 46b at the positions occupied by interbonding electrodes 6 and 26 in the semiconductor chips shown in FIG. 4 and FIG. 10, respectively. In addition, gate electrodes 42a provided at the four corners of the semiconductor chip of this embodiment are formed larger than gate electrodes 2 and 22a provided at the four corners of the semiconductor chips shown in FIG. 4 and FIG. 10, and these gate electrodes 42a thus take on the functions of interbonding electrodes. Higher integration of a semiconductor device is therefore allowed by providing more field effect transistor units 46a and 46b on a semiconductor chip.

The constructions of each of gate electrodes 42b, source electrode 43, drain electrode 44, gate bus bar 45, and field effect transistor units 46a of the semiconductor chip shown in FIG. 14 are equivalent to those of the semiconductor chip shown in FIG. 10, and explanation is therefore here omitted.

Figure 15:
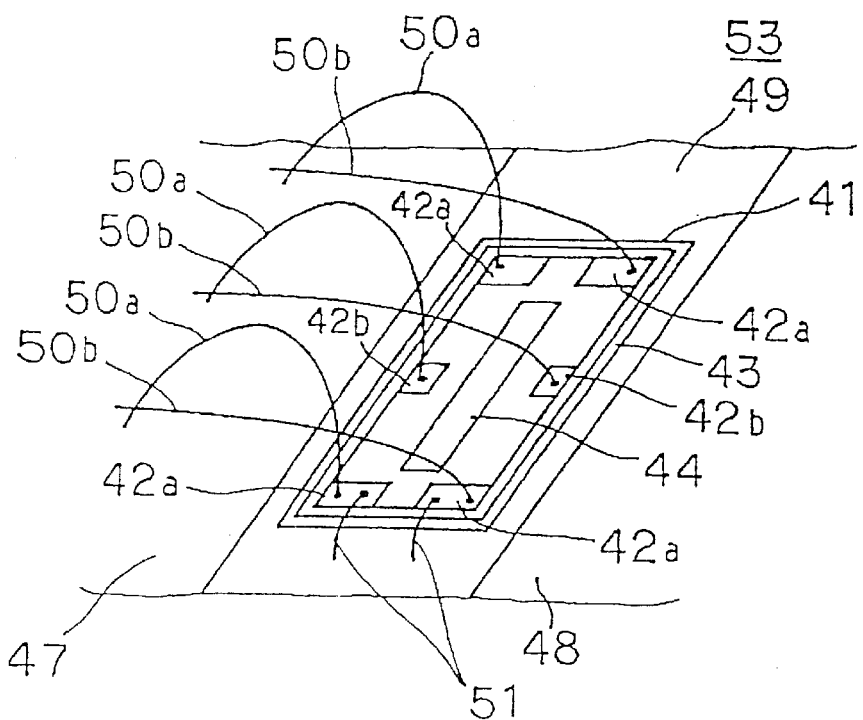
FIG. 15 is a perspective view showing the state of connection of the semiconductor chip shown in FIG. 14 to the input matching circuit substrate of a semiconductor device.

FIG. 15 shows a case in which the semiconductor chip shown in FIG. 14 is connected to the input matching circuit substrate of a semiconductor device. The construction of a package (not shown) provided with input matching circuit substrate 47, output matching circuit substrate 48, chip mounting section 49, input lead wires and output lead wires of semiconductor device 53 shown in FIG. 15 is equivalent to that of the prior-art semiconductor device shown in FIG. 1, and detailed explanation is therefore here omitted.

As in semiconductor device 17 shown in FIG. 6, in semiconductor device 53 of this embodiment, metal wires 50a, which connect input matching circuit substrate 47 to gate electrodes 42a and 42b that are positioned close to input matching circuit substrate 47, and metal wires 50b, which connect input matching circuit substrate 47 to gate electrodes 42a and 42b that are positioned far from input matching circuit substrate 47, are provided with the same length. Input signals transmitted on each of metal wires 50a and 50b are therefore inputted to semiconductor chip 41 without the occurrence of phase differences. In addition, gate electrodes 42a provided in the four corners of the semiconductor chip of this embodiment are formed larger and can therefore also perform the functions of interbonding electrodes 6 and 26 shown in FIG. 4 and FIG. 10. A plurality of semiconductor chips may therefore be connected in a chain by connecting gate electrodes 42a of mutually adjacent semiconductor chips (not shown) by metal wires 51.

Figure 16:
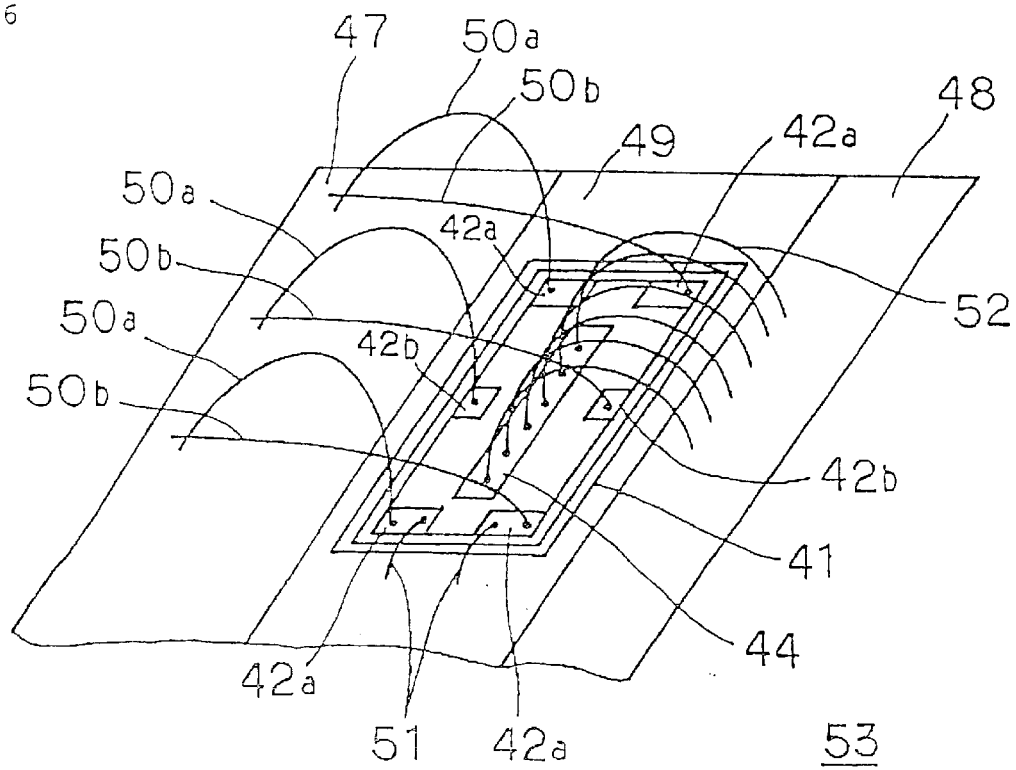
FIG. 16 is a perspective view showing the state of connection of the semiconductor chip shown in FIG. 14 to the circuit substrate of a semiconductor device.
Figure 17:
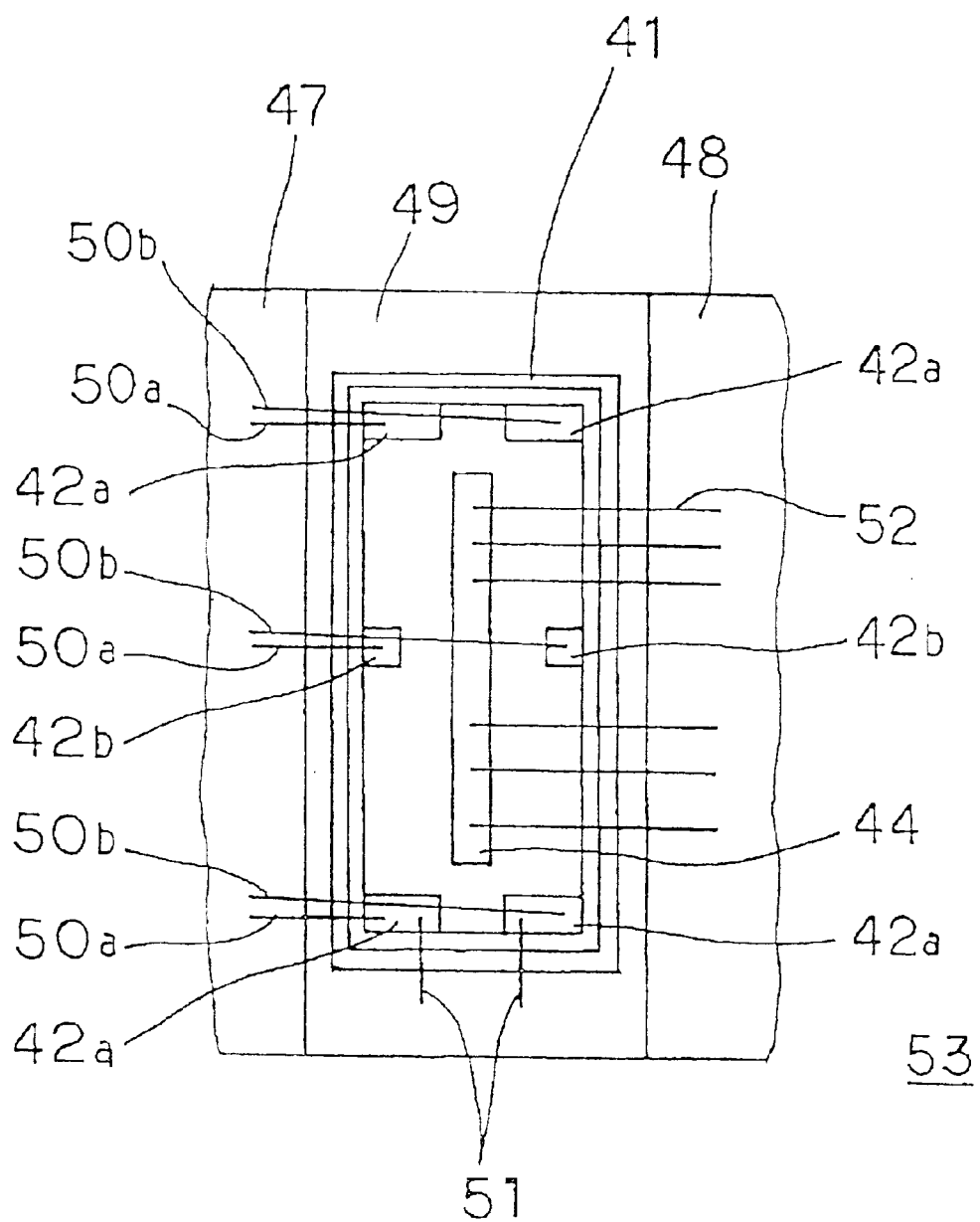
FIG. 17 is a plan view showing the semiconductor device shown in FIG. 16.

FIG. 16 and FIG. 17 show a case in which the semiconductor chip shown in FIG. 14 is connected to the circuit substrate of a semiconductor device. Drain electrode 44 of semiconductor chip 41 is connected to output matching circuit substrate 48 of semiconductor device 53 by a plurality of metal wires 52. As explained hereinabove with reference to FIG. 15, gate electrodes 42a and 42b are connected to input matching circuit substrate 47 by metal wires 50a and 50b, and gate electrodes 42a of adjacent semiconductor chips (not shown) are connected by metal wires 51.

Fourth Embodiment

Parasitic oscillation tends to occur in field effect transistor units in constructions in which gate bus bars 5, 25, and 45 are formed as a loop along the outer edge of the semiconductor chip, as in the semiconductor chips shown in FIG. 4, FIG. 10, and FIG. 14. As a countermeasure, the occurrence of parasitic oscillation in a field effect transistor unit can be prevented by dividing one portion of loop-formed gate bus bar 65 by providing a divided portion 65a in one portion of gate bus bar 65, as in the semiconductor chip of this embodiment shown in FIG. 18.

Figure 18:
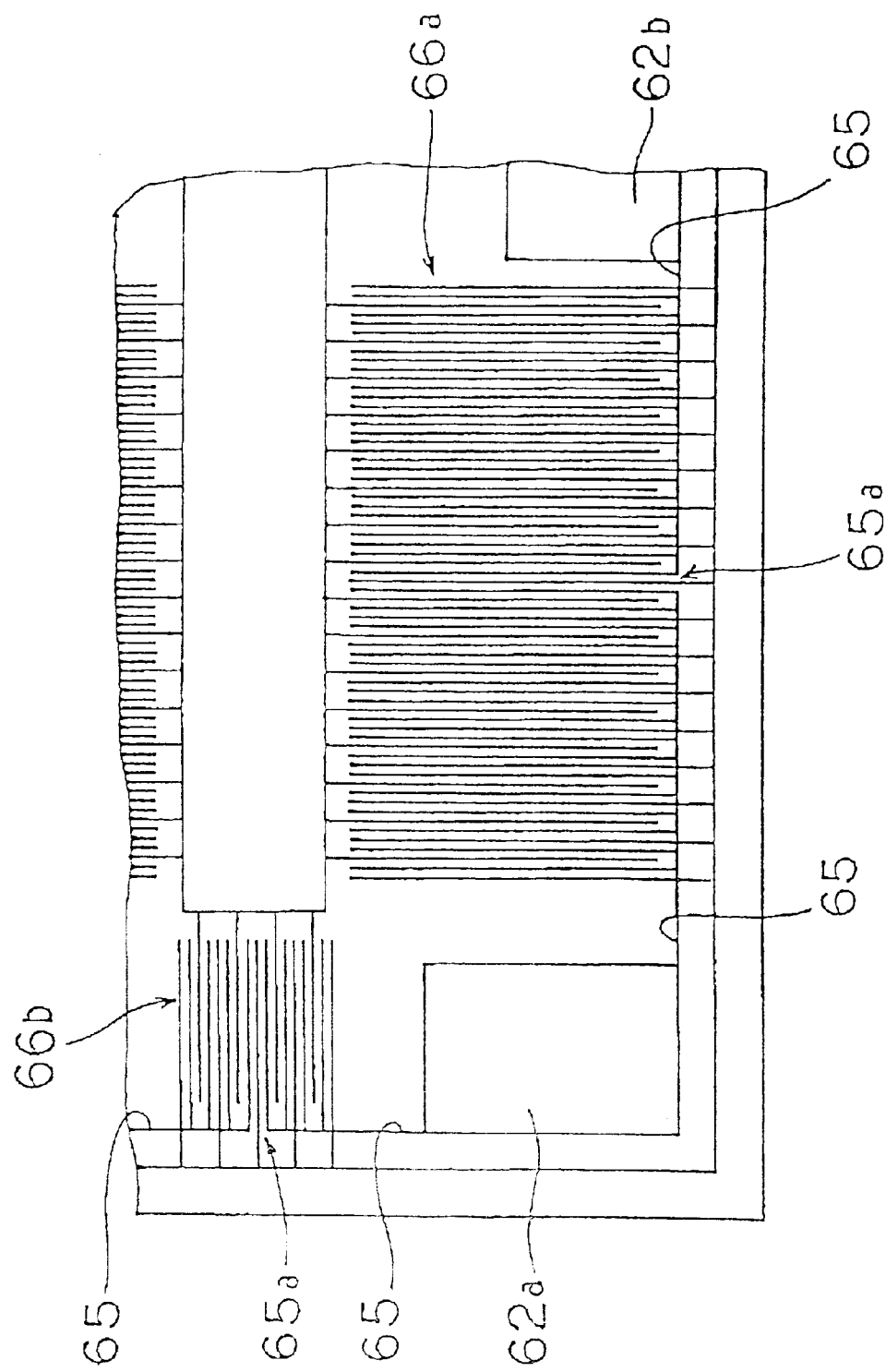
FIG. 18 is a plan view showing an enlargement of one portion of the semiconductor chip according to the fourth embodiment of the semiconductor device of the present invention.

The constructions of each of gate electrodes 62a and 62b, source electrode 63, drain electrode 64, field effect transistor units 66a and 66b of the semiconductor chip shown in FIG. 18 are equivalent to the constructions of the semiconductor chip shown in FIG. 14, and detailed explanation is therefore here omitted.

While preferred embodiments of the present invention have been described using specific terms, such description is for illustrative purposes only, and it is to be understood that changes and variations may be made without departing from the spirit or scope of the following claims.

What is claimed is:

1. A semiconductor chip comprising:
    a source electrode formed on the outer edge of said semiconductor chip from the obverse to the reverse surfaces of said semiconductor chip;
    a gate electrode;
    a drain electrode;
    a gate bus bar connected to said gate electrode; and
    a field effect transistor unit made up of three adjacent and coplanar fingers each extending from said source electrode, said gate bus bar, and said drain electrode,
    wherein said gate bus bar is formed in a loop configuration interior to and along said source electrode on the obverse surface of said semiconductor chip, and
    said source electrode forms a closed loop.

2. A semiconductor chip according to claim 1 wherein said gate bus bar formed as a loop is divided between two adjacent gate fingers in at least one portion.

3. A semiconductor chip according to claim 1, wherein said gate bus bar forms a closed loop.

4. A semiconductor chip comprising:
    a source electrode formed on the outer edge of said semiconductor chip from the obverse to the reverse surfaces of said semiconductor chip;
    a gate electrode;
    a drain electrode;
    a gate bus bar connected to said gate electrode; and
    a field effect transistor unit made up of three adjacent and coplanar fingers each extending from said source electrode, said gate bus bar, and said drain electrode,
    wherein said gate bus bar is formed in a loop configuration interior to and along said source electrode on the obverse surface of said semiconductor chip,
    said source electrode forms a closed loop, and
    said gate bus bar forms a closed loop.

5. A semiconductor chip according to claim 4 further comprising four gate electrodes each of said four gate electrodes formed on one of four corners of said semiconductor chip.

6. A semiconductor chip according to claim 4 wherein said drain electrode is formed on the central portion of said semiconductor chip.

7. A semiconductor device comprising:
    a chip mounting section in which a semiconductor chip is joined and mounted, said semiconductor chip comprising a source electrode formed on the outer edge of said semiconductor chip from the obverse to the reverse surfaces of said semiconductor chip, a gate electrode, a drain electrode, a gate bus bar connected to said gate electrode, and a field effect transistor unit made up of three adjacent and coplanar fingers each extending from said source electrode, said gate bus bar, and said drain electrode;
    an input matching circuit substrate to be connected to gate electrodes of said semiconductor chip; and
    an output matching circuit substrate to be connected to the drain electrode of said semiconductor chip
    wherein said source electrode forms a closed loop; and
    said gate bus bar forms a closed loop.

8. A semiconductor device according to claim 7 further comprising at least four gate electrodes formed on said semiconductor chip and surrounding said drain electrode; each of said gate electrodes are connected to said input matching circuit substrate by metal wires; and each of said metal wires are formed with the same length.

9. A semiconductor device according to claim 7 further comprising at least six gate electrodes formed on said semiconductor chip and surrounding said drain electrode, each of said gate electrodes being connected to said input matching circuit substrate by metal wires, and each of said metal wires being formed with the same length,
    wherein two of said six gate electrodes are formed on opposing edges of said semiconductor chips approximately equidistant from corners of said semiconductor chip.

* * * * *